(12) United States Patent　　　　　(10) Patent No.:　US 12,592,544 B2

Westbergh　　　　　　　　　　　　　　(45) Date of Patent:　Mar. 31, 2026

(54) VERTICAL-CAVITY SURFACE-EMITTING LASER (VCSEL) HAVING SEPARATE ELECTRICAL AND OPTICAL CONFINEMENT

(71) Applicant: Mellanox Technologies, Ltd., Yokneam (IL)

(72) Inventor: Petter Westbergh, Gothenburg (SE)

(73) Assignee: Mellanox Technologies, Ltd., Yokneam (IL)

( * ) Notice: Subject to any disclaimer, the term of this patent is extended or adjusted under 35 U.S.C. 154(b) by 716 days.

(21) Appl. No.: 17/865,597

(22) Filed: Jul. 15, 2022

(65) Prior Publication Data

US 2024/0022046 A1　　Jan. 18, 2024

(51) Int. Cl.
　　*H01S 5/183*　　　(2006.01)
　　*H01S 5/125*　　　(2006.01)
　　*H01S 5/34*　　　(2006.01)

(52) U.S. Cl.
　　CPC .......... *H01S 5/18394* (2013.01); *H01S 5/125* (2013.01); *H01S 5/18361* (2013.01); *H01S 5/34* (2013.01)

(58) Field of Classification Search
　　CPC .. H01S 5/183; H01S 5/18333; H01S 5/18336; H01S 5/18338
　　See application file for complete search history.

(56) References Cited

U.S. PATENT DOCUMENTS

| | | | | |
|---|---|---|---|---|
| 2018/0301865 A1* | 10/2018 | Burroughs | ............ | H01S 5/0028 |
| 2019/0305522 A1* | 10/2019 | Yuen | ................... | H01S 5/04254 |
| 2020/0076161 A1* | 3/2020 | Fujii | ................... | H01S 5/18358 |
| 2021/0184432 A1* | 6/2021 | Berk | ....................... | H01S 5/423 |

FOREIGN PATENT DOCUMENTS

GB　　　　2442767 A　*　4/2008　........... H01L 33/105

* cited by examiner

*Primary Examiner* — Minsun O Harvey
(74) *Attorney, Agent, or Firm* — Michael M. McCraw; Moore & Van Allen PLLC

(57)　　　　　　ABSTRACT

Vertical-cavity surface-emitting lasers (VCSELs) and associated methods of manufacturing are provided. An example VCSEL includes a first reflector, a second reflector, and an active region disposed between the first reflector and the second reflector. The VCSEL further includes an electrical aperture defining a current confinement region configured to direct current to the active region and an optical aperture defining a medium through which light produced by the active region is emitted from the VCSEL. At least one dimension of the optical aperture of the VCSEL is formed independent of the electrical aperture of the VCSEL. In some instances, the dimension of the optical aperture is a first diameter such that the first diameter of the optical aperture is formed independent of a second diameter defined by the electrical aperture.

21 Claims, 5 Drawing Sheets

600

VERTICAL-CAVITY SURFACE-EMITTING LASER (VCSEL) HAVING SEPARATE ELECTRICAL AND OPTICAL CONFINEMENT

TECHNOLOGICAL FIELD

Example embodiments of the present disclosure relate generally to communication systems and, more particularly, to optical components defining separate electrical and optical confinement regions.

BACKGROUND

Vertical-cavity surface-emitting lasers (VCSELs) are semi-conductor lasers configured to emit a laser beam from the top surface of the semi-conductor chip. VCSELs are used in a variety of applications, including fiber optic communications, that require precise modulation of various laser characteristics. Common manufacturing techniques, however, provide little flexibility in controlling the laser output of a VCSEL. Through applied effort, ingenuity, and innovation, many of these identified problems have been solved by developing solutions that are included in embodiments of the present disclosure, many examples of which are described in detail herein.

BRIEF SUMMARY

In order to address these problems and others, embodiments of the present application provide VCSEL implementations with separate or otherwise independent optical and electrical apertures. With reference to an example vertical-cavity surface-emitting laser (VCSEL), the VCSEL may include a first reflector, a second reflector, and an active region disposed between the first reflector and the second reflector. The VCSEL may further include an electrical aperture and an optical aperture. The electrical aperture may define a current confinement region configured to direct current to the active region. The optical aperture may define a medium through which light produced by the active region is emitted from the VCSEL. At least one dimension of the optical aperture may be formed independent of the electrical aperture so as to provide implementations with separate electrical and optical confinement.

In some embodiments, the dimension of the optical aperture may be a first diameter such that the first diameter of the optical aperture is formed independent of a second diameter defined by the electrical aperture. In such an embodiment, the second diameter of the electrical aperture may be greater than the first diameter of the optical aperture.

In some further embodiments, the electrical aperture and the optical aperture may each define respective circular cross-sectional shapes.

In some further embodiments, an emission path of the optical aperture defining a direction at which light is emitted by the VCSEL and a central axis that intersects a center of the electrical aperture may not be collinear.

In other further embodiments, the electrical aperture and the optical aperture may be nonconcentric.

In some embodiments, the optical aperture may define a first cross-sectional shape that is different than a second cross-sectional shape defined by the electrical aperture.

In some embodiments, the VCSEL may further include a plurality of optical apertures including the optical aperture where the plurality of optical apertures are associated with the electrical aperture.

In some embodiments, at least a portion of the VCSEL is formed via an interrupted growth procedure.

In some embodiments, the electrical aperture may be defined via an ion implantation procedure.

In some embodiments, the optical aperture may be defined via a photolithography process.

In some embodiments, the first reflector and the second reflector may each include distributed Bragg reflector (DBR) stacks.

In some embodiments, the active region may further include a multi-quantum well (MQW) layer stack comprising a series of quantum wells disposed between a series of barriers.

A method of manufacturing a VCSEL as described above is further provided. The method may include the steps of forming a first reflector on a substrate, creating, on top of the first reflector, an active region, and forming a second reflector on top of the active region. The method may further include the steps of interrupting formation of the second reflector, forming a current confinement region defining an electrical aperture configured to direct current to the active region, and forming an optical aperture through which light produced in the active region is emitted from the VCSEL. At least one dimension of the optical aperture may be formed independent of the electrical aperture. The method may subsequently include the step of resuming formation of the second reflector.

In some embodiments, the dimension of the optical aperture formed by this method may be a first diameter that is formed independent of a second diameter defined by the electrical aperture.

In some embodiments, the second diameter of the electrical aperture formed by this method may be greater than the first diameter of the optical aperture.

In some further embodiments, the electrical aperture and the optical aperture formed by this method may each define respective circular cross-sectional shapes that are noncon-centric.

In some further embodiments, the optical aperture of the VCSEL formed by this method may be formed in the absence of an oxidation feature provided in forming the second reflector.

In some further embodiments, the method may further include forming the electrical aperture via an ion implantation procedure.

In some further embodiments, the method may further include forming the optical aperture via a photolithography process.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Having thus described certain example embodiments of the present disclosure in general terms, reference will now be made to the accompanying drawings. The components illustrated in the figures may or may not be present in certain embodiments described herein. Some embodiments may include fewer (or more) components than those shown in the figures.

Figure 1:
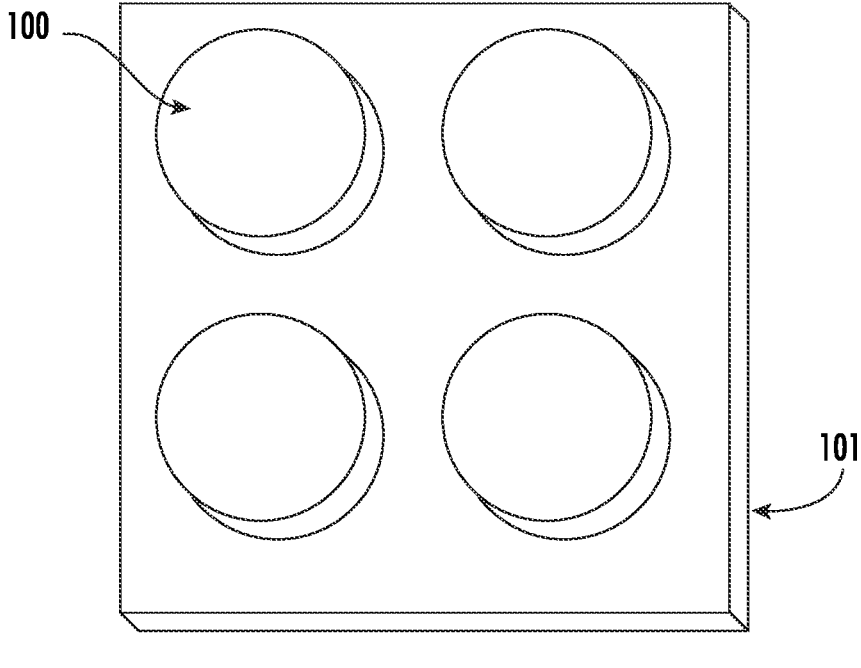

FIG. 1 illustrates a plurality of VCSEL structures on a single substrate, in accordance with one or more embodiments of the present invention.

Figures 2A, 2B, 2C:
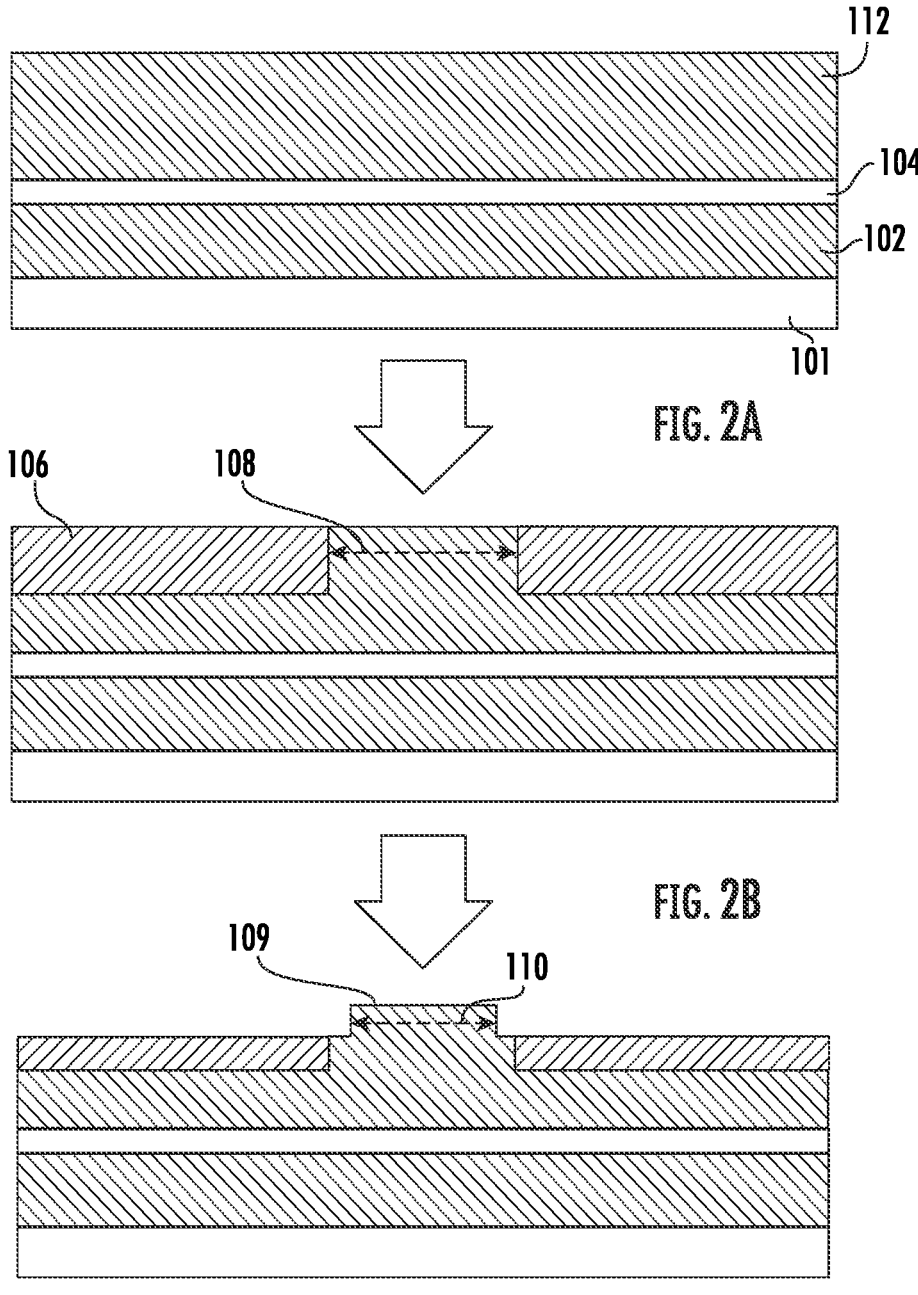

FIG. 2A illustrates a schematic cross-sectional view of an initial growth process in manufacturing a VCSEL with separate electrical and optical confinement, in accordance with one or more embodiments of the present invention.

FIG. 2B illustrates a schematic cross-sectional view of an implantation step for defining the electrical confinement region in a VCSEL with separate electrical and optical confinement, in accordance with one or more embodiments of the present invention.

FIG. 2C illustrates a schematic cross-sectional view for an etching step for defining the optical aperture in a VCSEL with separate electrical and optical confinement, in accordance with one or more embodiments of the present invention.

Figure 3:
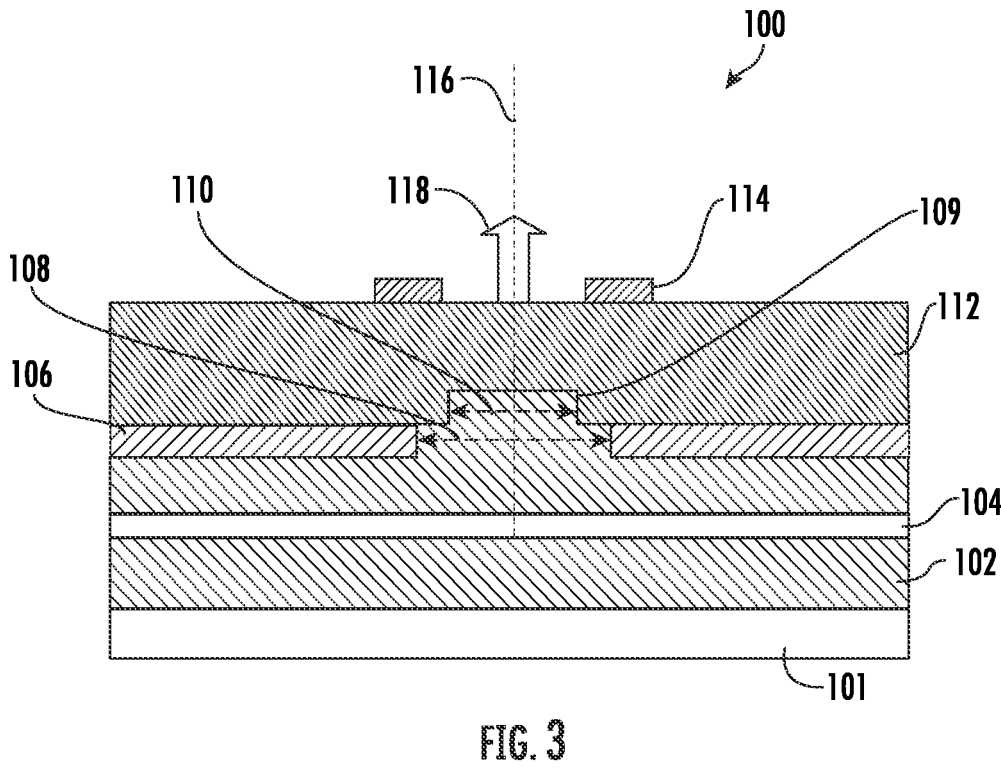

FIG. 3 illustrates a cross-sectional view of an example VCSEL with separate electrical and optical confinement, in accordance with one or more embodiments of the present invention.

Figure 4:
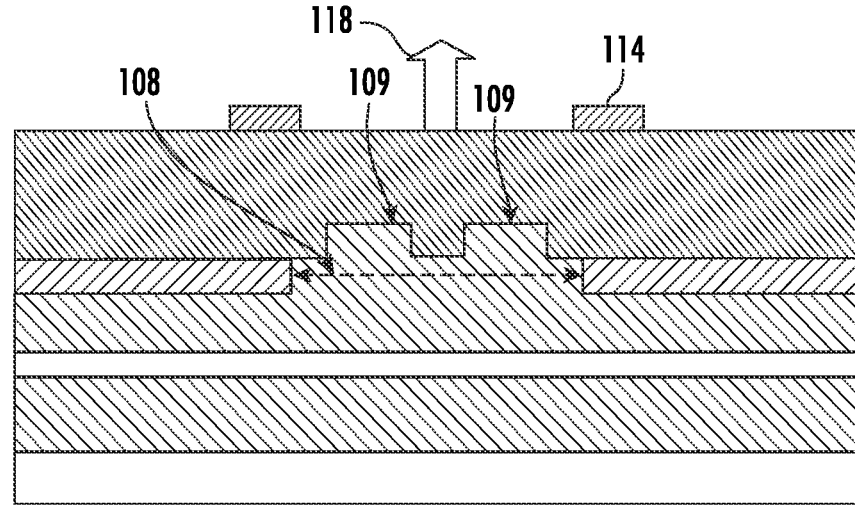

FIG. 4 illustrates a schematic cross-sectional view of an example VCSEL with more than one optical aperture for a single electrical aperture, in accordance with one or more embodiments of the present invention.

FIGS. 5A-5F illustrate various example VCSEL configurations having optical and electrical apertures of varying sizes and shapes, in accordance with one or more embodiments of the present invention.

Figure 6:
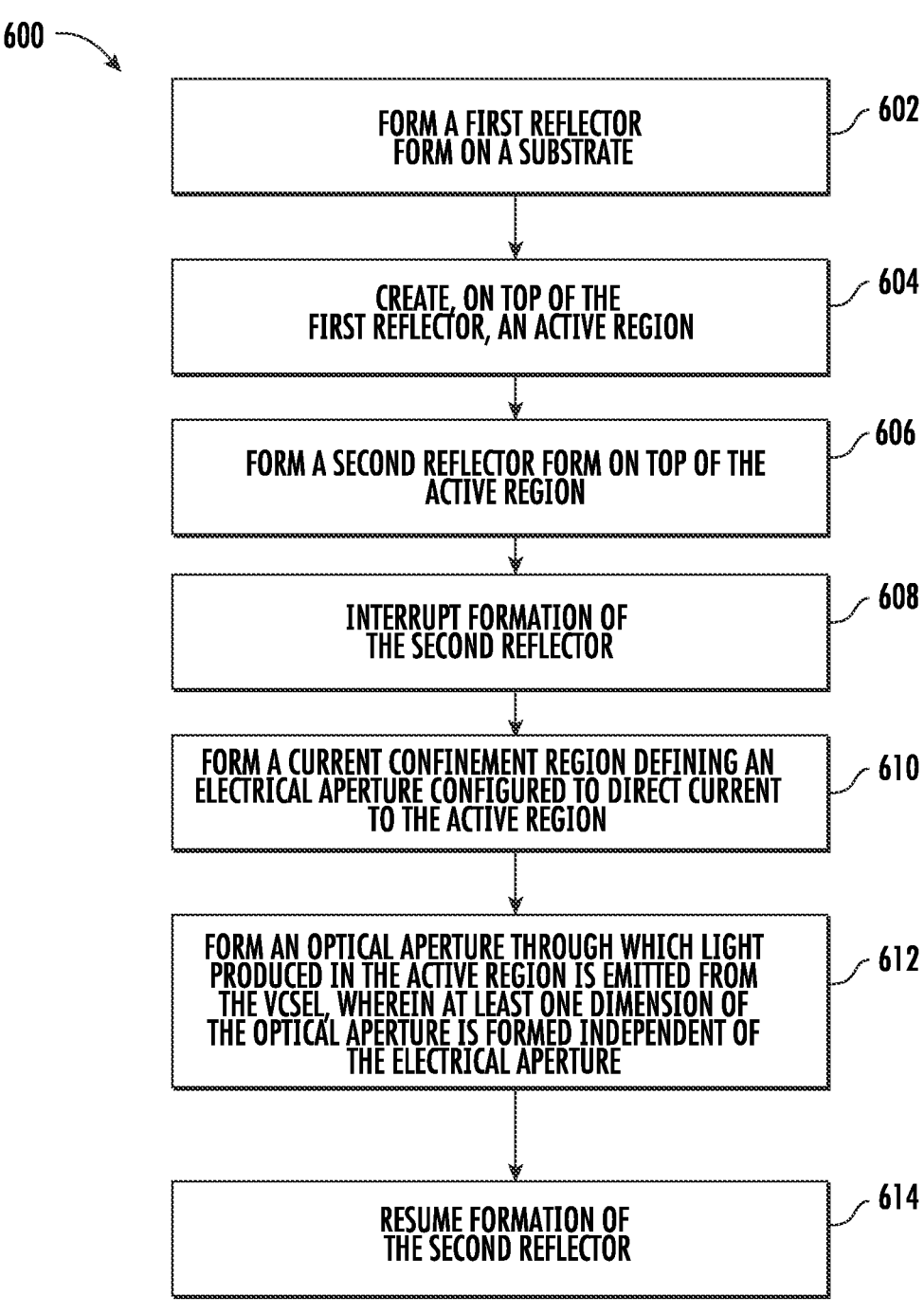

FIG. 6 provides a flowchart illustrating various processes, procedures, and/or operations for fabricating a VCSEL having separate electrical and optical confinement, in accordance with one or more embodiments of the present invention.

DETAILED DESCRIPTION

Overview

Various embodiments of the present disclosure now will be described more fully hereinafter with reference to the accompanying drawings, in which some, but not all embodiments are shown. Indeed, the present disclosure may be embodied in many different forms and should not be construed as limited to the embodiments set forth herein; rather these embodiments are provided so that this disclosure will satisfy applicable legal requirements. Like numbers refer to like elements throughout.

Example embodiments of the present disclosure are directed to a VCSEL with separately defined electrical and optical confinement regions. In general, when a VCSEL is fabricated, the confinement regions for electrical currents and optical output are defined simultaneously. This process defines a single opening or aperture when defining electrical confinement and optical confinement regions. If the manufacturing process is adjusted to create a larger optical aperture, the opening to the electrical confinement, or electrical aperture, is also increased. Similarly, if the manufacturing process is adjusted to create a smaller electrical aperture, the optical aperture must also be reduced in size. In other words, the dimensions of the optical aperture and the electrical aperture in conventional VCSELs are dependent upon one another. As such, it is desirable to define the electrical aperture and the optical aperture independently to provide increased flexibility in the laser output based on the electrical input to the lasing region.

There are also a number of deficiencies and problems associated with the present methods for fabricating VCSELs. For example, in the traditional oxide confined, buried tunnel junction, or proton implant methods, the optical and electrical apertures in the device are defined in the same process. As such, the VCSELs generated by these traditional methods result is electrical and optical apertures that are same size, have the same geometry, and are in the same location. Requiring the electrical and optical apertures to be substantially identical in size, geometry, and location results in the the laser gain based on the injected current, the beam width of the output laser, and the beam profile to each be defined by this aperture. This requirement of conventional implementations may be suboptimal for matching the desired optical output with the injected current and subsequent gain profile.

Accordingly, the embodiments described herein further provide methods of manufacturing VCSELs having electrical and an optical apertures having independent dimensions and geometry. Defining the dimensions and the geometry of the electrical and optical apertures independently provides flexibility in varying the properties of the laser output. For example, the electrical aperture may be modified to adjust the laser output gain based on the input current, while the optical aperture may be separately adjusted to optimize the beam width and laser beam profile. Providing flexibility in separately defining the electrical and optical aperture may improve the efficiency in operation and overall performance of the VCSEL.

The terms "illustrative," "exemplary," and "example" as may be used herein are not provided to convey any qualitative assessment, but instead merely to convey an illustration of an example. Thus, use of any such terms should not be taken to limit the spirit and scope of embodiments of the present invention. The phrases "in one embodiment," "according to one embodiment," and/or the like generally mean that the particular feature, structure, or characteristic following the phrase may be included in at least one embodiment of the present disclosure and may be included in more than one embodiment of the present disclosure (importantly, such phrases do not necessarily refer to the same embodiment).

Example VCSEL

FIG. 1 illustrates a top view of a plurality of VCSELs 100 disposed on a substrate 101. In some embodiments, the plurality of VCSELs 100 may be manufactured on a single substrate 101. As described herein, VCSELs 100 may be manufactured by a growth process on a base substrate 101, and, in some embodiments, may be manufactured via an interrupted growth process. As would be evident in light of the present disclosure, the VCSELs 100 described herein may each be configured to generate optical signals (e.g., emitting light 118) out a vertical surface of the VCSEL. Although described herein with reference to a single VCSEL 100 for ease of description, the present disclosure contemplates that a plurality of VCSELs 100 may be manufactured on a single substrate 101 through substrate growth and photolithographic processes. In other words, the operations and features described herein may be equally applicable to a plurality of VCSELs 100 grown on a single substrate 101.

FIG. 2A-2C illustrate schematic cross-sectional views of an example process for manufacturing the VCSEL 100 with an independently defined electrical aperture 108 and optical aperture 109. With reference to FIG. 2A, a schematic cross-sectional view of an active region 104 disposed between a first reflector 102 and a partially grown second reflector 112 is shown. As illustrated in FIG. 2A, the first reflector 102 further disposed on top of a substrate 101, such as the substrate described above with reference to FIG. 1. FIG. 2A further illustrates an active region 104. In some embodiments, the active region 104 may include a plurality of quantum wells (e.g., by which light 118) is generated between the first reflector 102 and second reflector 112. In some embodiments, the active region 104 may comprise a multi-quantum well (MQW) layer stack comprising a series of quantum wells disposed between a series of quantum barriers. In various embodiments, the MQW layer stack may be formed from GaAs or InP-based semiconductor materials.

In some embodiments, the first reflector 102 may be formed of a semi-conductor material with alternating high and low refractive indices to create a Distributed Bragg Reflector (DBR) mirror. For example, in some embodiments, the first reflector 102 may include alternating layers of relatively high aluminum content and relatively low aluminum content aluminum gallium arsenide (AlGaAs). As would be evident in light of the present disclosure, the relative aluminum content between alternating layers of AlGaAs may vary based upon the intended application of the first reflector 102. In some embodiments, the DBR mirror of the first reflector 102 may include a doped semi-conductor (e.g., n-doped). In other embodiments, the DBR mirror of the first reflector 102 may include layers of an un-doped semi-conductor material. Although based upon the intended application of the VCSEL 100, the thickness of each layer of the first reflector 102 may be approximately one quarter of the wavelength of the light that is generated in the active region 104. Although described herein with reference to an example AlGaAs based implementation, the present disclosure contemplates that any applicable materials (e.g., Indium Phosphide (InP) based components or the like) may be used. In other words, the present disclosure contemplates that the techniques described herein may be applicable to any materials associated with or leveraged by optical components.

Similar to the first reflector 102, the second reflector 112 may also include a semi-conductor material with alternating high and low refractive indices to create a DBR mirror. For example, in some embodiments, the second reflector 112 may include alternating layers of relatively high aluminum content and relatively low aluminum content aluminum gallium arsenide (AlGaAs). In some embodiments, the DBR mirror of the second reflector 112 may include a doped semi-conductor; however, the doping of the semi-conductor in the second reflector 112 may be opposite the doping of the first reflector 102 (e.g., p-doped). In other embodiments, the DBR mirror of the first reflector 102 may include layers of an un-doped semi-conductor material. The thickness of each individual layer is of the second reflector may also be approximately a quarter of the wavelength of the light that is generated in the active region 104. By disposing the active region between the first reflector 102 and second reflector 112, the light intensity may be amplified as the light is reflected back and forth before being released through the optical aperture 109. In some embodiments, the VCSEL 100 may further include a current spreading layer disposed on each side of the active region 104 so as to provide electricity to the active region 104. In some embodiments, the current spreading layers may allow for un-doped layers of a semi-conductor material to be used for the first reflector 102 and/or the second reflector 112. For example, a DBR mirror of the first reflector 102 and the second reflector 112 may include alternating layers of un-doped relatively high aluminum content and relatively low aluminum content AlGaAs.

As illustrated in FIG. 1, the VCSEL 100 may be formed and/or fabricated on a semi-conductor substrate 101, such as a silicon substrate, a GaAs substrate, and/or other appropriate substrate. In various embodiments, a plurality of VCSELs 100 may be generated on a single substrate 101 (e.g., a wafer). Once fabrication of one or more VCSEL 100 and/or other electrical and/or optical devices are fabricated on the substrate 101, the substrate 101 (e.g., wafer) may be diced into multiple chips. For example, the VCSEL 100 and/or electrooptical systems formed on the substrate (e.g., wafer) may be separated via a dicing procedure, used as an array of VCSEL 100, incorporated into an integrated VCSEL 100 system, and/or the like, as appropriate for the intended application.

With reference to FIG. 2B, a schematic cross-section view of a current confinement region 106 partially occupying the top-most layers of the partially grown second reflector 112 but not penetrating far enough to reach the active region 104 is illustrated. The current confinement region 106 does not occupy a portion of the occupied layers leaving a path from the active region 104 to the top of the structure, unobstructed by the current confinement region 106. The area defined by the opening in the current confinement region 106 of the occupied layers of the second reflector 112 defines an electrical aperture 108. In some embodiments, the current confinement region 106 may be configured to provide lateral electrical (current) confinement in the active region 104. As further described in block 610 of FIG. 6, the current confinement region 106 may be formed by defining the electrical aperture 108 through a photolithographic process and/or creating a current confinement region 106 using ion implantation to the unmasked areas of the partially grown second reflector 112.

As shown, the current confinement region 106 provides an opening through which electrical current may enter the active region 104. This opening, herein referred to as the electrical aperture 108, is defined by the area protected from ion implantation during the creation of the current confinement region 106. In various embodiments, light 118 is generated by injecting electrical current through the electrical aperture 108 defined by the opening in the current confinement region 106. Defining the electrical aperture 108 using photolithographic processes and ion implantation allows for precise definition of the shape of the electrical aperture 108. As further explained in block 612 of FIG. 6, defining the electrical aperture 108 using photolithographic processes and independently of the optical aperture 109 allows flexibility in creating the desired laser profile.

With reference to FIG. 2C a schematic cross-sectional view of an optical aperture 109 protruding from the surface of the partially grown second reflector 112 after the surrounding second reflector 112 material has been removed is shown. The protruding optical aperture 109 may define a cross-sectional optical dimension 110. The optical aperture 109 provides an opening through which energy particles and/or photons in the form of light 118 may pass. As described in detail in block 612 of FIG. 6, the optical aperture 109 is formed using a photolithographic masking and a shallow etch of the partially grown second reflector 112. In some embodiments, the photolithographic etch may be a shallow etch wherein the etch removes between approximately 1 nanometer to approximately a quarter wavelength of unmasked semiconductor material. In some embodiments, the photolithographic etch may be a shallow etch wherein the etch removes between approximately 6 nanometers and approximately 14 nanometers of unmasked semiconductor material. In some embodiments, the photo-lithographic etch may be a shallow etch wherein the etch removes between approximately 8 and approximately 12 nanometers. In some embodiments, the photolithographic etch may be a shallow etch wherein the etch removes between approximately 9 and approximately 10 nanometers. The photolithographic process may be utilized to precisely define the shape and dimensions of the optical aperture 109. The optical aperture 109 may provide a waveguide through which light 118 may be emitted out the vertical surface of the structure and the VCSEL 100. Flexibility in precisely defining the size and shape of the optical aperture 109 and optical dimension 110, independently of the electrical aperture 108, allows greater precision in creating the desired laser profile for a VCSEL 100.

FIG. 3 illustrates a schematic cross-sectional view of a completed VCSEL 100 with separate electrical and optical confinement, in accordance with one or more embodiments of the present disclosure. It will be appreciated that the VCSEL 100 is provided as an example of an embodiment(s) and should not be construed to narrow the scope or spirit of the disclosure in any way. The depicted VCSEL 100 includes an active region 104 disposed between two reflectors, a first reflector 102 positioned below the active region 104 and a substrate 101, and the second reflector 112 positioned on the surface of the active region 104 opposite the first reflector 102 as described above. The second reflector 112, disposed on the surface of the active region 104 opposite the first reflector 102 contains a current confinement region 106. The current confinement region 106 partially occupies one or more layers within the second reflector 112 leaving an opening in the occupied layers of the second reflector 112 through which electrical current may pass. The defined opening in the current confinement region 106 is an electrical aperture 108. An optical aperture 109 is defined in the second reflector 112 layers adjacent to the layers occupied by the current confinement region 106 and opposite the active region 104. The optical aperture 109 at least partially overlaps the electrical aperture 108 defining a waveguide through which light 118 passes along an emission axis 116. The waveguide created by the optical aperture 109 has a representative dimension described herein as the optical dimension 110.

Attached to the surface of the second reflector 112, opposite the active region 104 are one or more contact pads 114. The contact pads 114 are offset from the emission axis 116 allowing emitted light 118 to pass unobstructed. The contact pads 114 may be a thin metal layer or other conductor configured to distribute current across the surface of the active region 104 adjacent to the second reflector 112. In some embodiments, the second reflector 112 may be doped such that the current may reach the active region 104 through the second reflector 112. In some embodiments, a current spreading layer may be disposed between the second reflector 112 and the active region 104. In such embodiments, trenches or vias (not shown) may be etched to provide direct electrical connection from the contact pads 114 to the current spreading layer adjacent the surface of the active region 104.

Similarly, in some embodiments, the contact pads 114 may be in electrical contact with the surface of the active region 104 between the active region 104 and the first reflector 102. In some embodiments, the electrical current provided to the surface of the active region 104 adjacent the first reflector 102 and the electrical current provided to the surface of the active region 104 adjacent the second reflector 112 may provide electrical bias (e.g., a voltage differential and/or a current) to surfaces of the active region 104 that are substantially perpendicular to the emission axis 116. For example, the contact pads 114 may be configured (with corresponding contact layers or otherwise) to establish a voltage differential and/or provide a current between the surface of the active region 104 adjacent and/or abutting the first reflector 102 and the surface of the active region 104 adjacent and/or abutting the second reflector 112 creating a lasing effect and emitting light 118 along the emission axis 116.

The emission axis 116 may be substantially perpendicular with respect to the surface of the active region 104. As such, the emission axis 116 may be directed from the active region 104 through the second reflector 112 in a direction opposite the first reflector 102. The emission axis 116 may define the direction of the light 118 emitted from the active region 104. The optical aperture 109 having the optical dimension 110 may operate as a waveguide to direct the light 118 along the emission axis 116 and into an optical transmission medium (e.g., optical fiber or otherwise) to transmit the emitted signal.

FIG. 3 further depicts light 118 emitted through the second reflector 112 along the emission axis 116. The light 118 may be generated when an electrical bias is created across the active region 104, exciting the atoms within the active region 104 to create optical gain. The light 118 builds up as it is continually reflected between the first reflector 102 and the second reflector 112. Once the light 118 reaches a sufficient excited state, the light 118 passes through the second reflector 112 and is emitted perpendicular to the surface of the VCSEL 100 along the emission axis 116. The optical aperture 109 may act as a waveguide to direct the light 118 along the emission axis 116 and shape the profile of the emitted light 118.

FIG. 4 illustrates an example VCSEL 100 including a plurality of optical apertures 109 associated with a single electrical aperture 108. In some embodiments, the example VCSEL 100 may include a plurality of optical apertures 109 defining a plurality of cross-sectional optical dimensions 110. As described below with reference to block 612 of FIG. 6, the optical apertures 109 may be formed using a photolithographic masking and a shallow etch of the partially grown second reflector 112. In some embodiments, photolithographic masking and etching may be used to form a plurality of optical apertures 109. In such an embodiment, the optical apertures 109 may provide a plurality of a waveguides through which light 118 may be emitted out the vertical surface of the structure and the VCSEL 100. Associating a plurality of optical apertures 109 with a single electrical aperture 108 may allow greater flexibility in controlling the profile of the generated light 118.

Figure 5:
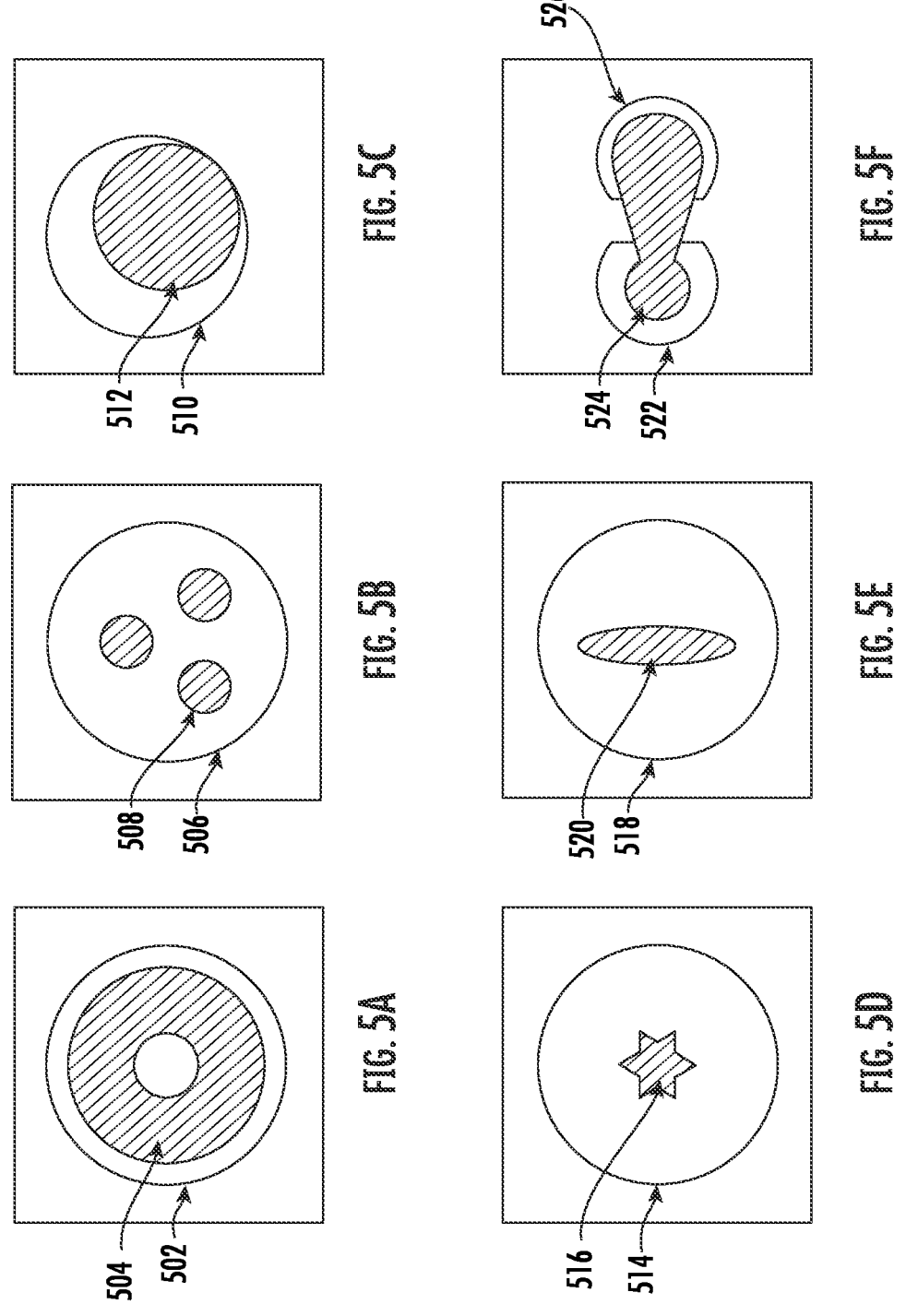

FIGS. 5A-5F illustrate top views of example optical apertures 109 and their associated electrical apertures 108. It will be appreciated that the depictions are provided as example embodiments and should not be construed to narrow the scope or spirit of the disclosure in any way. FIG. 5A illustrates a top view of an optical aperture 504 through which light may be emitted during operation of the example VCSEL 100. The optical aperture 504 may be a cylindrical feature protruding above the surface of the current confinement region 106. However, the center of the optical aperture 504 may remain level with the surface of the current confinement region 106 creating a donut-shaped protrusion raised off the surface of the current confinement region 106. The electrical aperture 502 depicted may be circular in shape and may encompass the entirety of the optical aperture 504 protrusion. In some embodiments, the electrical aperture 502 may be smaller than the outer radius of the optical aperture 504. In some embodiments, a plurality of electrical apertures 502 may be formed.

FIG. 5B illustrates a top view of an example optical aperture 508 through which light may be emitted during operation of the VCSEL 100. The optical aperture 508 is illustrated with three (3) cylindrical features protruding above the surface of the current confinement region 106. The electrical aperture 506 depicted may encompass the entirety of the optical aperture 508 protrusions. In some embodiments, a plurality of electrical apertures 506 may be formed and associated with the optical aperture 508.

FIG. 5C illustrates a top view of an example optical aperture 512 through which light may be emitted during operation of the VCSEL 100. The optical aperture 512 is illustrated with a cylindrical protrusion that is nonconcentric with a circular electrical aperture 510. The electrical aperture 510 depicted may encompass the entirety of the optical aperture 512 protrusion. In some embodiments, the radius of the electrical aperture 510 associated with the optical aperture 512 may be smaller than the radius of the optical aperture 512.

FIG. 5D illustrates a top view of an example optical aperture 516 through which light may be emitted during operation of the VCSEL 100. The optical aperture 516 is illustrated as a star-shaped protrusion raised above the surface of the second reflector 112. In some embodiments, the circular electrical aperture 514 depicted may encompass the entirety of the optical aperture 516 protrusion, while in other embodiments, the electrical aperture 514 may be smaller than the optical aperture 516 protrusion. The shape of the optical aperture 516 illustrates the flexibility and preciseness that may be achieved when forming an optical aperture 109 according to the embodiments presented herein.

FIG. 5E illustrates a top view of an example optical aperture 520 through which light may be emitted during operation of the VCSEL 100. The optical aperture 520 is illustrated as an oval protrusion raised above the surface of the second reflector 112. In some embodiments, the circular electrical aperture 518 depicted may encompass the entirety of the optical aperture 520 protrusion, while in other embodiments, the electrical aperture 518 may be smaller than the optical aperture 520.

FIG. 5F illustrates a top view of an example optical aperture 524 through which light may be emitted during operation of the VCSEL 100. The optical aperture 524 depicted is a keyhole-shaped protrusion raised above the surface of the second reflector 112. In some embodiments, a plurality of electrical apertures 522, 526 may be formed and associated with the optical aperture 524. The electrical apertures 522, 526 depicted in FIG. 5F may also be non-circular. The shape of these electrical apertures 522, 526 further illustrate the flexibility and preciseness that may be achieved when forming an electrical aperture according to the embodiments presented herein.

FIG. 6 provides a flowchart illustrating a method 600 for manufacturing a VCSEL 100 having separate electrical and optical confinement, in accordance with one or more embodiments of the present disclosure. At block 602, the method 600 may form a first reflector 102 on a substrate 101. The first reflector 102 may be formed by epitaxially growing layers of semi-conductor material with alternating high and low refractive indices to create a distributed Bragg reflector (DBR) mirror. In some embodiments, the first reflector 102 may include alternating layers of aluminum gallium arsenide (AlGaAs) and gallium arsenide (GaAs). In some embodiments, the DBR mirror of the first reflector 102 may include a doped semi-conductor (e.g., n-doped). In other embodiments, the DBR mirror of the first reflector 102 may include layers of un-doped semi-conductor material.

At block 604, the method 600 may create, on top of the first reflector, an active region. The active region may include one or more quantum wells. The quantum well is similarly created by an epitaxial growth process or using chemical vapor deposition. A quantum well may be created when a thin layer of semi-conductor (e.g., GaAs or InGaAs) is grown between two layers of a semi-conductor with a larger band gap (e.g., AlGaAs or gallium arsenide phosphide (GaAsP)) capable of producing a gain region from which light 118 is produced. In some embodiments, the active region 104 may include multi-quantum wells (MQLs) of VCSEL 100 gain media. For example, the MQLs may comprise a stack or a series of quantum wells disposed between a series of quantum barriers.

At block 606, the method 600 may form a second reflector 112 on top of the active region 104. The second reflector 112 may be formed similar to the first reflector 102 using an epitaxial growth process to create a DBR. In some embodiments, the second reflector 112 may also include alternating layers of relatively high aluminum content and relatively low aluminum content aluminum gallium arsenide (AlGaAs). In some embodiments, the DBR mirror of the second reflector 112 may include a doped semi-conductor (e.g., p-doped). In other embodiments, the DBR mirror of the second reflector 112 may include layers of un-doped semi-conductor material.

At block 608, the method 600 may interrupt formation of the second reflector 112. At this step in the process, the epitaxial growth process is stopped before the completion of the second reflector 112, leaving an incomplete second reflector 112. The epitaxial regrowth process described herein may be accomplished via various techniques, such as Metal-Organic Chemical Vapor Deposition (MOCVD) processes, Molecular Beam Epitaxy (MBE) regrowth processes, and/or any technique that results in epitaxial growth or regrowth.

At block 610, the method 600 may form a current confinement region 106 defining an electrical aperture 108 configured to direct current to the active region 104. In some embodiments, the current confinement region 106 may be defined through ion implantation using a photolithographic process. This process may involve applying a photo resistive material or hard mask capable of blocking the penetration of implanting ions. After application of the photo resistive material or hard mask, the photo resistive material or hard mask may then be removed from areas in which ion implantation will be performed. Once the areas to receive ion implantation have been exposed, ions are accelerated toward the surface of the partially grown second reflector 112. Surface areas unprotected by the protective mask will receive ions implanted into the surface of the second reflector 112. The implantation of ions for purposes of defining the current confinement region 106 may increase the resistivity of the affected surface regions. The region of the surface of the second reflector 112 protected by the photo resistive material or hard mask defines the electrical aperture 108. The electrical aperture 108 may not be bombarded by the implanted ions and may maintain its conductive properties. The electrical aperture 108 allows applied current to flow predominantly through the opening. Adjusting the size and shape of the electrical aperture 108 modifies the input current required and the output gain achieved. For example, reducing the size of the electrical aperture 108 may create a higher power output given the same current input. Using ion implantation and a photolithographic process on a partially grown second reflector 112 to define the current confinement region 106 and thus the electrical aperture 108, allows flexibility in defining the electrical aperture 108 independent of the optical dimension 110. By way of example, a relatively smaller electrical aperture 108 may provide a reduced threshold current, increased differential resistance, increased voltage drop, and/or increased modulation speed (at the same bias current).

In order to facilitate regrowth of the second reflector 112 after performing ion implantation, an ion species compatible with regrowth may be used. In some embodiments, for example, oxygen, germanium, or silicon ions may be used for implantation. To perform regrowth on top of the current confinement region 106 implanted with ions, the surface may need to be annealed. For some species of ion, annealing will repair the region bombarded with ions and diminish the desired resistive properties. Thus, to maintain proper current confinement in the current confinement region 106, ion species capable of withstanding annealing may be used.

Further, in some embodiments, the defining of a current confinement region 106 and electrical aperture 108 as described in block 610 may be performed after block 612. At block 612, the method 600 may form an optical aperture 109 through which the light 118 produced in the active region 104 is emitted from the VCSEL 100, wherein at least one dimension of the optical aperture 109 is formed independent of the electrical aperture 108. In some embodiments, the optical aperture 109 may be formed through a photolithographic etch process. A photolithographic etch may be performed by using a masking process to protect the surface of the partially grown second reflector 112 where the optical aperture 109 is to be formed. Once the exposed surface of the second reflector 112 is etched and the masking material is removed, an optical aperture 109 will be formed as shown in FIG. 2C, defining an optical dimension 110 through which light produced in the active region 104 is emitted. As described above, the optical aperture 109 acts as a waveguide for the emitted laser output. Defining the optical aperture 109 through a photolithographic process allows greater precision and flexibility in the shape of the optical aperture 109. For example, an optical aperture 109 may be defined in any shape, such as a coupled keyhole, a star, triangle, rectangle, or oval.

In addition, defining the optical aperture 109 independently from the electrical aperture 108 adds another dimension of flexibility in developing the optimal laser output. For example, a plurality of optical apertures 109 may be arranged in an array, guiding the laser output of a single electrical aperture 108, thus changing the profile of the laser output. The optical dimension 110 may also be defined in dimensions smaller than the electrical aperture 108. Conventional designs and methods fail to define the current confinement region 106 and electrical aperture 108 separately thereby failing to provide the unique size and geometries described herein. In addition, conventional methods do not provide for an electrical aperture 108 that is larger than the optical aperture 109.

At block 614, the method 600 may resume formation of the second reflector 112. Once the current confinement region 106 is formed through ion implantation and the optical aperture 109 is formed using a shallow etch, the surface of the current confinement region 106 and the optical aperture 109 may be repaired to facilitate regrowth. In some embodiments, this repair may include annealing that occurs as part of the epitaxial growth process. The ion species used for formation of the current confinement region 106 may be able to maintain position and maintain the resistivity properties of the current confinement region 106 while other damage introduced to these areas are annealed during the regrowth process described herein. Once annealing is complete via the regrowth process, the fabrication of the second reflector 112 is resumed using an epitaxial growth process to create a DBR, similar to the growth of the first reflector 102 and initial growth of the second reflector 112. In some embodiments, the second reflector 112 regrowth may continue as alternating layers of relatively high aluminum content and relatively low aluminum content aluminum gallium arsenide (AlGaAs). In some embodiments, the DBR mirror of the second reflector 112 may include a doped semi-conductor (e.g., n-doped). In other embodiments, the DBR mirror of the first reflector 102 may include layers of un-doped semi-conductor material. Once the electrical aperture 108 and the optical aperture 109 have been independently defined, and the second reflector 112 has been subsequently regrown, contact pads 114 may be placed in electrical contact with the top layer of second reflector 112 and the lower surface of the active region 104.

Many modifications and other embodiments of the inventions set forth herein will come to mind to one skilled in the art to which these inventions pertain having the benefit of teachings presented in the foregoing descriptions and the associated drawings. Although the figures only show certain components of the apparatus and systems described herein, it is understood that various other components may be used in conjunction with the system. Therefore, it is to be understood that the inventions are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. The disclosed embodiments relate primarily to a basketball arena environment, however, one skilled in the art may recognize that such principles may be applied to a hockey game, a soccer match, a football game, a concert, or in any other arena environment. Alternative embodiments that result from combining, integrating, and/or omitting features of the embodiment(s) are also within the scope of the disclosure. Accordingly, the scope of protection is not limited by the description set out above.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure.

Use of broader terms such as "comprises," "includes," and "having" should be understood to provide support for narrower terms such as "consisting of," "consisting essentially of," and "comprised substantially of" Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

The invention claimed is:

1. A vertical-cavity surface-emitting laser (VCSEL) comprising:
   a first reflector;
   a second reflector;
   an active region disposed between the first reflector and the second reflector;
   a current confinement region defining an electrical aperture configured to direct current to the active region; and
   an optical aperture disposed between the first reflector and the second reflector defining a medium through which light produced by the active region is emitted from the VCSEL,
   wherein at least one dimension of the optical aperture is formed independent of the electrical aperture of the current confinement region.

2. The VCSEL of claim 1, wherein the dimension of the optical aperture is a first diameter such that the first diameter of the optical aperture is formed independent of a second diameter defined by the electrical aperture of the current confinement region.

3. The VCSEL of claim 2, wherein the second diameter of the electrical aperture is greater than the first diameter of the optical aperture.

4. The VCSEL of claim 2, wherein the electrical aperture and the optical aperture each define respective circular cross-sectional shapes.

5. The VCSEL of claim 4, wherein an emission path of the optical aperture defining a direction at which light is emitted by the VCSEL and a central axis that intersects a center of the electrical aperture are not collinear.

6. The VCSEL of claim 4, wherein the electrical aperture and the optical aperture are nonconcentric.

7. The VCSEL of claim 1, wherein the optical aperture defines a first cross-sectional shape that is different than a second cross-sectional shape defined by the electrical aperture.

8. The VCSEL of claim 1, further comprising a plurality of optical apertures including the optical aperture, wherein the plurality of optical apertures are associated with the electrical aperture.

9. The VCSEL of claim 1, wherein the VCSEL is formed via an interrupted growth procedure.

10. The VCSEL of claim 1, wherein the electrical aperture is defined via an ion implantation procedure.

11. The VCSEL of claim 1, wherein the optical aperture is defined via a photolithography process.

12. The VCSEL of claim 1, wherein the first reflector and the second reflector each comprise distributed Bragg reflector (DBR) stacks.

13. The VCSEL of claim 1, wherein the active region further comprises a multi-quantum well (MQW) layer stack comprising a series of quantum wells disposed between a series of barriers.

14. The VCSEL of claim 1, wherein the electrical aperture is disposed between the first reflector and the second reflector.

15. A method of manufacturing a VCSEL, the method comprising:
   forming a first reflector on a substrate;
   creating, on top of the first reflector, an active region;
   forming a second reflector on top of the active region;
   interrupting formation of the second reflector;
   forming a current confinement region defining an electrical aperture configured to direct current to the active region;
   forming an optical aperture disposed between the first reflector and the second reflector through which light produced in the active region is emitted from the VCSEL, wherein at least one dimension of the optical aperture is formed independent of the electrical aperture of the current confinement region; and
   resuming formation of the second reflector.

16. The method of claim 15, wherein the dimension of the optical aperture is a first diameter that is formed independent of a second diameter defined by the electrical aperture.

17. The method of claim 16, wherein the second diameter of the electrical aperture is greater than the first diameter of the optical aperture.

18. The method of claim 15, wherein the electrical aperture and the optical aperture each define respective circular cross-sectional shapes that are nonconcentric.

19. The method of claim 15, wherein the optical aperture of the VCSEL is formed in the absence of an oxidation feature provided in forming the second reflector.

20. The method of claim 15, further comprising forming the electrical aperture via an ion implantation procedure.

21. The method of claim 15, further comprising forming the optical aperture via a photolithography process.

* * * * *